United States Patent
Brueckner

(10) Patent No.: US 6,573,781 B1
(45) Date of Patent: Jun. 3, 2003

(54) METHOD FOR THE OPERATION OF AN ELECTRONIC CIRCUIT UTILIZING TWO DIFFERENT VOLTAGE LEVELS AND ELECTRONIC CIRCUIT

(75) Inventor: Roland Brueckner, Weissenhorn (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 09/657,192

(22) Filed: Sep. 7, 2000

(30) Foreign Application Priority Data

Sep. 7, 1999  (DE) .......................... 199 42 688

(51) Int. Cl.⁷ .................................. G05F 1/10
(52) U.S. Cl. ...................... 327/544; 327/112
(58) Field of Search ................. 326/85, 87, 91; 327/108, 109, 110, 111, 112, 530, 544

(56) References Cited

U.S. PATENT DOCUMENTS

| | | | | |
|---|---|---|---|---|
| 4,829,199 A | * | 5/1989 | Prater | 307/443 |
| 5,122,690 A | * | 6/1992 | Bianchi | 307/475 |
| 5,153,450 A | * | 10/1992 | Ruetz | 307/443 |
| 5,166,555 A | * | 11/1992 | Kano | 307/451 |
| 5,204,558 A | * | 4/1993 | Kumaki et al. | 307/475 |
| 5,959,473 A | * | 9/1999 | Sakuragi | 327/111 |
| 6,265,892 B1 | * | 7/2001 | Jou et al. | 326/27 |

FOREIGN PATENT DOCUMENTS

DE    38 08 737 A1    1/1989

* cited by examiner

Primary Examiner—Jeffrey Zweizig
(74) Attorney, Agent, or Firm—Schiff Hardin & Waite

(57) ABSTRACT

A method and apparatus for the operation of an electronic circuit that transmits information by a voltage variance such that a significant reduction in dissipated power can be achieved during the time segments without a bit change. Given a change from the first voltage level (U1) to the second voltage level (U2), the second voltage level (U2) is briefly exceeded for recognition of the signal edge and an approach to the second voltage level (U2) subsequently occurs.

16 Claims, 2 Drawing Sheets

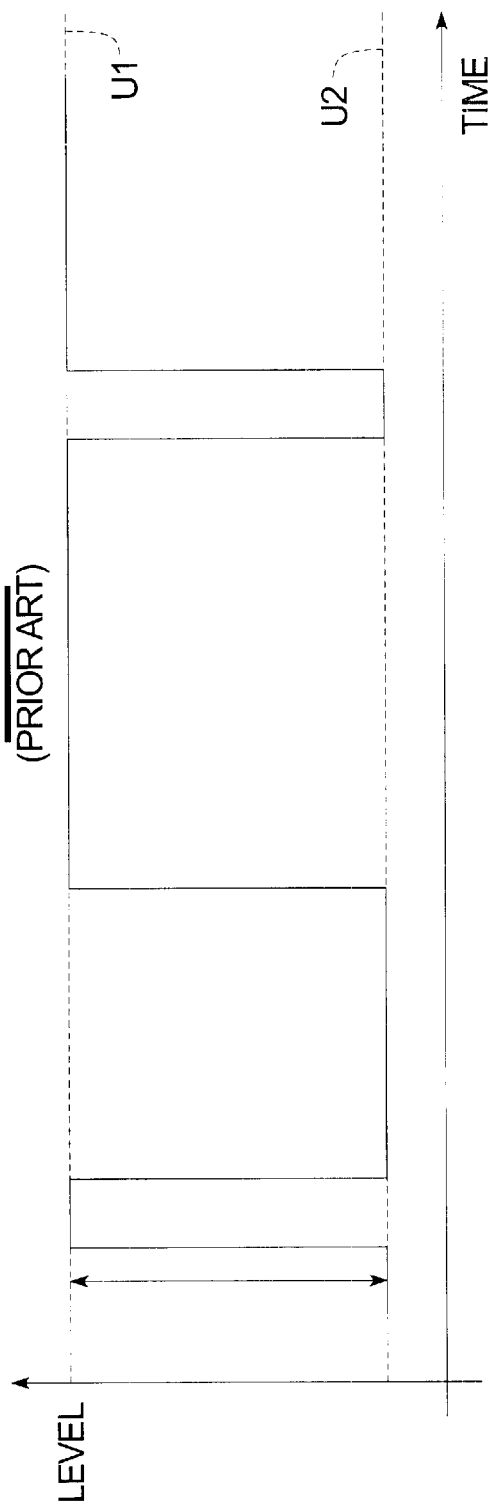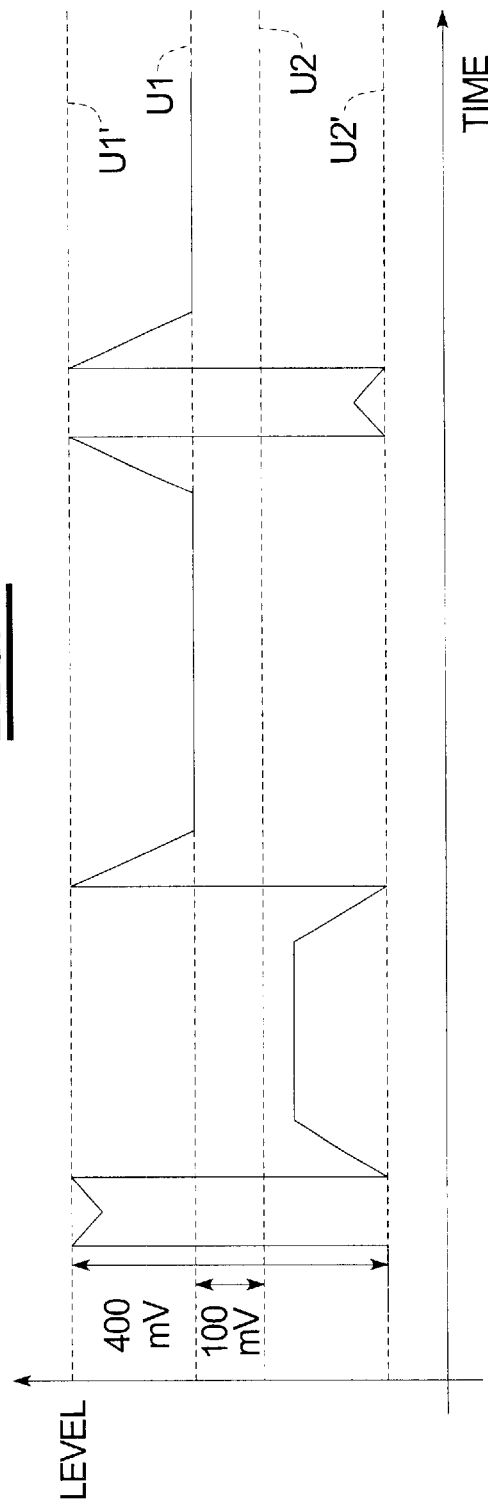

METHOD FOR THE OPERATION OF AN ELECTRONIC CIRCUIT UTILIZING TWO DIFFERENT VOLTAGE LEVELS AND ELECTRONIC CIRCUIT

BACKGROUND OF THE INVENTION

1. Field of the Invention

The present invention is directed to an electronic circuit and also to a method for the operation of an electronic circuit that internally or externally transmits information, in which two different voltage levels are generated by two current sources for signalling.

2. Description of the Prior Art

Such an electronic circuit and the method for the operation of the circuit is generally known (for example, in circuits using LVDS=low voltage differential signals or CML=current logic mode).

One disadvantage of this circuit is comprised therein that the dissipated power of such circuits is extremely high and they therefore require involved cooling systems, which usually are larger with respect to weight and space requirements than the circuits themselves.

It is therefore an object of the invention to provide a method and an electronic circuit arrangement that significantly reduces the amount of dissipated power that is generated.

A significant part of the dissipated power given the known circuits, particularly given what are referred to as "high-speed interconnect" connections, arise because an unnecessarily high voltage level is maintained for achieving signal edges that can be detected adequately well given a bit change, even in time segments wherein no bit change occurs, and this high voltage level leads to correspondingly unnecessarly high dissipated currents and a great deal of waste heat.

SUMMARY OF THE INVENTION

In order to avoid these losses, a significantly lower voltage level can be used during times without a bit change, i.e. without generating a detectable signal edge, whereas in case of a bit change the switching is carried out between the high voltage levels.

The present invention provides a method for the operation of an electronic circuit that internally or externally transmits information, whereby at least one first voltage level and one second voltage level are provided, such that the second voltage level is briefly exceeded for the recognition of the signal edge given a change from the first voltage level to the second voltage level and that an approach to the second voltage level subsequently occurs. In other words, the bit change occurs by a change in voltage levels having a greater magnitude, but the maintenance of the voltage after switching is accomplished by a voltage difference of a lesser magnitude, so that energy is saved.

An advantageous development of this method provides that a further, additional voltage level that is at a distance from the mean value of the voltage levels be allocated to the two voltage levels, this additional voltage levels is initially selected at the switchover time.

Advantageously, the voltage spacing of the two additional voltage levels can thereby be at least two times, preferably three times, preferably four times as great as the voltage spacing of the first voltage level from the second voltage level.

It is also inventively proposed that maintaining current sources are activated for maintaining the voltage levels during normal operation, i.e. without switching activity, and that an additional current source is cut in upon switchover between the voltage levels and then are subsequently disconnected.

The information to be transmitted can be transmitted as a bit sequence, whereby the two voltage levels represent a 0 and a 1.

Another advantage of the present invention is that the information can be transmitted via a "high-speed interconnect" connection, i.e. a connection whose necessary levels during AC operation (=data change) lies clearly above the level for correct recognition of the continuous signal relative to the noise signals. The allowed uncertainty of the voltage edge (=data edge) at the transmission time of the signal is thereby less than 5%, for example 250 ps peak-to-peak given a period duration of 5 ns.

Further advantageous developments of the inventive method provide that the method occurs in an ASIC component or in an interface with current switching (using for example, CML=current mode logic or LVDS=low voltage differential signals).

It is also advantageous when the first level is a high level and the second level is a low level.

Corresponding to the fundamental idea of the invention, the inventor also proposes an electronic circuit, particularly and ASIC, having a plurality of electrical connections for information transmission, whereby two different voltage levels are generated by two current sources for the signaling, to the effect that two further voltage sources are provided that can be briefly cut in for the recognition of the signal edge given a change from a first voltage level to a second voltage level.

An electronic circuit according to the present invention can also contain an edge recognition circuit that is preferably composed of a flipflop and an EXOR (exclusive OR) element.

Further, two through-connect transistors can be provided that connect the data signal through from an input to the output. Just as advantageously, an inverter can be provided or driving a through-connect transistor and a delay element can be allocated to the EXOR element.

Especially advantageously, the inventive electronic circuit can be employed in a "high-speed interconnect" connection.

Another possible use of this electronic circuit is in an interface with current switching (for examplel, CML=current mode logic).

It is self-evident that the aforementioned features of the invention that are yet to be explained below is not limited to the disclosed combination but may also be applied in other combinations or in isolation according to the scope of the invention.

DESCRIPTION OF THE DRAWINGS

The invention is described in greater detail below with reference to the drawings:

FIG. 1 is a signal diagram showing an example of a signals according to the prior art;

FIG. 2 is a signal diagram showing an example of an inventive signalling; and

DETAILED DESCRIPTION OF THE PREFERRED EMBODIMENTS

Figure 3:
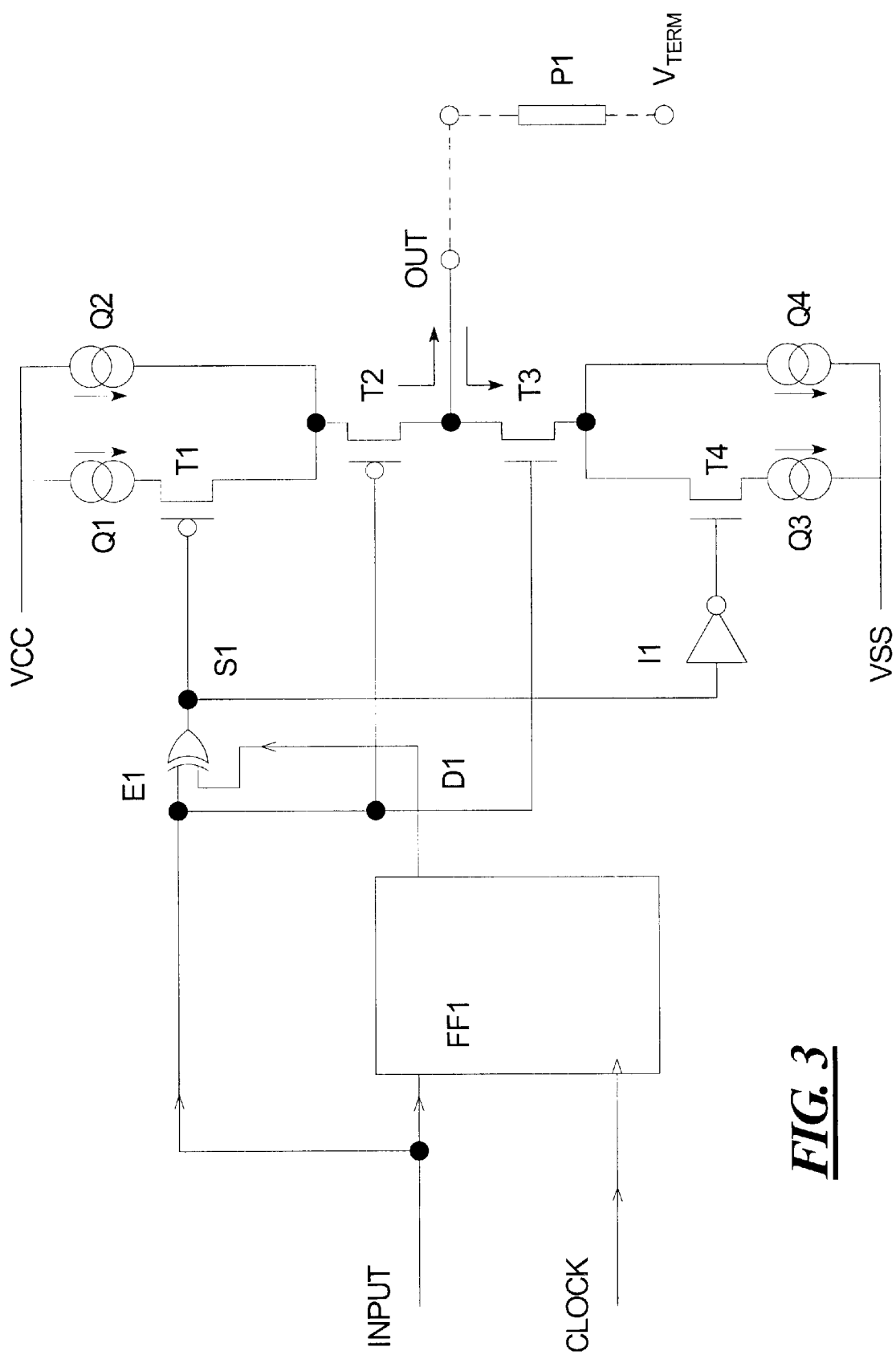
FIG. 3 is a circuit diagram which shows an example of a circuit implementation according to the present invention.

FIG. 1 shows the voltage signal diagram of a bit sequence corresponding to the prior art. The voltage level changes up and down between two states, i.e. voltage levels U1 and U2 having a maximum difference, with a steep signal edge that corresponds to the bit sequence to be transmitted. To provide a dependable signal edge recognition and for achieving a low jitter of approximately 140 ps, the voltage difference of the two values is 400 mV, even though a difference of 100 mV would be adequate for the mere recognition of a logical "1" at the input of an LVDS (=low voltage differential signal) circuit.

As a result thereof, the power dissipated by the circuit is high, even at times when a no bit change occurs.

FIG. 2 shows the bit sequence from FIG. 1 with a voltage curve according to the present invention. During times with a bit change, the signal difference of 400 mV between the first voltage level U1' and the second voltage level U2' is preserved, whereas the voltage level during time segments without a bit change is respectively returned to the corresponding voltage levels U1 and U2 having a smaller voltage difference. The difference between these reduced voltage levels U1 and U2 amounts to only 100 mV, so that a significant reduction in the dissipated power can be achieved in these time spans. For purposes of the present invention, the term "reduced voltage level" refers to voltage levels having a voltage difference of a lower magnitude, and not necessarily to voltages which themselves are of a lower magnitude.

A possible specific development of a circuit arrangement for realizing the above-described voltage signal is shown in FIG. 3.

Such an edge recognition circuit contains a flipflop FF1 and EXOR (exclusive OR) element E1, for transistors T1 through T4 and four current sources Q1 through Q4.

When an INPUT signal and a clocked INPUT signal D1 are unequal, then the EXOR SIGNAL S1 is at high level and thus cuts in the additional current sources Q1 or, Q3 via the transistors T1 or, T4. The additional current sources Q1 or, Q3 guarantee an adequately high current/voltage level at the switching time and the switching edge is lent an adequately high steepness.

The transistors T2 or, T3 through-connect the actual data signal onto the output line OUT.

The current sources Q2, Q4 see to the maintaining of the minimum level U1, U2 given a static output signal.

The inverter I1 serves for the correct drive of the transistor T3.

Optionally, the EXOR element E1 can be provided with a delay element, for example T equal to clock/2, in order to assure a "soft" cut-in disconnection of the current sources Q1 and Q3.

Overall, thus, a significant reduction of the dissipated power occurring in a circuit for the transmission of data is achieved with the disclosed inventive method and the inventive circuit arrangement.

Although other modifications and changes may be suggested by those skilled in the art, it is the intention of the inventors to embody within the patent warranted hereon all changes and modifications as reasonably and properly come within the scope of their contribution to the art.

What is claimed is:

1. A method for operation of an electronic circuit that transmits information at least one of internally and externally, comprising the steps of:

providing a voltage for information transmittal, said voltage varying among a first voltage level and a second voltage level;

temporarily increasing said voltage above said second voltage level to a higher voltage level for a recognition of a signal edge upon a change of said voltage from said first voltage level to said second voltage level; and reducing said voltage from said higher voltage level to the second voltage level after said temporary increase.

2. A method according to claim 1, wherein said voltage varies among a third voltage level and a fourth voltage, a first absolute value of a difference between said third voltage level and said fourth voltage level exceeds a second absolute value of a difference between said first voltage level and said second voltage level, said third voltage level and said fourth voltage level being initially selected in a switching time.

3. A method according to claim 2, wherein the first absolute value is at least one of two and a three and a four times the second absolute value.

4. A method according to claim 1, further comprising the steps of:

maintaining current sources during normal operation with no switching activity;

cutting in additional current sources with said current sources upon said voltage state switching between voltage levels;

disconnecting said additional current sources.

5. A method according to claim 1, wherein said information is being transmitted as bit sequences, said first voltage level and said second voltage level representing a 0 and a 1, respectively.

6. A method according to claim 1, wherein said information is transmitted via high speed inter-connect connection.

7. A method according to claim 1, wherein said providing step and said temporary increasing step and said approaching step occur in an ASIC component.

8. A method according to claim 1, wherein said providing step and said temporary increasing step and said reducing step occur in an interface with current switching.

9. A method according to claim 1, wherein the first voltage level is a high level and the second voltage level is a low level.

10. An electronic circuit with a plurality of electrical connections for information transmission, comprising:

a first voltage level and a second voltage level, said first voltage level being different from said second voltage level;

two current sources for signaling, a third voltage level and a fourth voltage level being created by said two current sources; and two further different current sources that temporarily cut in along with said two current sources for a recognition of a signal edge, said two further different current sources creating said first voltage level and said second voltage level at an output.

11. An electronic circuit according to claim 10, further comprising:

a signal edge recognition circuit including a flip-flop and an EXCLUSIVE OR element.

12. An electronic circuit according to claim 10, further comprising:

two through-connected transistors that connect data signal through from an input to an out put, said input and said output part of said electronic circuit.

13. An electronic circuit according to claim 10, further comprising:

an inverter for a drive of a through connect transistor.

14. An electronic circuit according to claim 10, wherein said electronic circuit is utilized for a high-speed interconnect connection.

15. An electronic circuit according to claim 10, wherein said electronic circuit is utilized for an interface with current switching.

16. An electronic circuit according to claim 10, wherein said electronic circuit is an application specific integrated circuit.

* * * * *